United States Patent
Tu et al.

(10) Patent No.: US 7,148,517 B2
(45) Date of Patent: Dec. 12, 2006

(54) LIGHT EMITTING DIODE AND METHOD OF THE SAME

(75) Inventors: Chung-Cheng Tu, Taipei (TW); Jin-Ywan Lin, Taoyuan (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 10/951,043

(22) Filed: Sep. 24, 2004

(65) Prior Publication Data

US 2005/0242358 A1 Nov. 3, 2005

(30) Foreign Application Priority Data

Apr. 29, 2004 (TW) .............................. 93112012 A

(51) Int. Cl.
*H01L 29/221* (2006.01)
*H01L 33/00* (2006.01)
(52) U.S. Cl. .......................... 257/96; 257/79; 257/81; 257/98; 257/99; 257/E25.032; 438/22
(58) Field of Classification Search ................... 257/81, 257/94, 96, 97, 98, 99, 103
See application file for complete search history.

(56) References Cited

U.S. PATENT DOCUMENTS 6,287,882 B1    9/2001  Chang et al.
6,593,597 B1 *  7/2003  Sheu ........................... 257/94
6,597,019 B1 *  7/2003  Inoue et al. ................ 257/99
6,661,032 B1 * 12/2003  Meng et al. ................ 257/99
6,861,677 B1 *  3/2005  Chen ........................... 257/99
2003/0122139 A1 * 7/2003  Meng et al. ................ 257/81

OTHER PUBLICATIONS

Homg et al; "AlGInP light-emitting Diodes with Mirror Substrates Fabricated by Wafer Bonding"; *Appl. Phys. Lett.*, vol. 75, No. 20, Nov. 15, 1999; pp. 3054-3056.

* cited by examiner

*Primary Examiner*—Evan Pert
*Assistant Examiner*—Victor A. Mandala, Jr.
(74) *Attorney, Agent, or Firm*—Ingrassia, Fisher & Lorenz, P.C.

(57) ABSTRACT

A light emitting diode and a method of the same are provided. The light emitting diode includes a light-emitting structure, a silicon substrate and a bonding layer. The light-emitting structure includes two semiconductor layers of different doped types. The light-emitting structure is capable of emitting light when a current passes through. The silicon substrate includes two zones of different doped types. The bonding layer is interposed between the light-emitting structure and the silicon substrate so that the semiconductor layer and the zone closest to the bonding layer are of different doped types.

17 Claims, 4 Drawing Sheets

LIGHT EMITTING DIODE AND METHOD OF THE SAME

CROSS REFERENCE TO RELATED APPLICATIONS

This application claims priority to Taiwan Patent Application No. 093112012 entitled "Light Emitting Diode and Method of the Same", filed on Apr. 29, 2004, which is incorporated herein by reference and assigned to the assignee herein.

FIELD OF INVENTION

The present invention generally relates to a light emitting diode and a method of the same.

BACKGROUND OF THE INVENTION

High illumination light emitting diodes generally use GaAs substrates or sapphire substrates, which are poor in thermal dissipation and not suitable for high power applications. Conventionally, the light emitting structure formed on the GaAs substrate or the sapphire substrate is transferred onto a silicon substrate by wafer bonding technology, and then the GaAs or sapphire substrate is removed so as to solve the thermal dissipation problem.

Horng et al. published an article entitled "AlGaInP light-emitting diodes with mirror substrates fabricated by wafer bonding" in Vol. 75, No. 20, 3054, Appl. Phys. Lett. (1999). Horng et al. disclosed an AlGaInP light emitting diode with a Au/AuBe/SiO$_2$/Si mirror substrate by wafer bonding in which AuBe/Au is used as adhesive to bond a silicon substrate and a light emitting epitaxial layer.

U.S. Pat. No. 6,287,882 is granted to Chang et al., entitled "Light emitting diode with a metal-coated reflective permanent substrate and method for manufacturing the same". Chang et al. disclosed a AlGaInP/metal/silicon light emitting diode by wafer bonding, which uses metal as adhesive to bond a silicon substrate and a light emitting epitaxial layer.

Therefore, there is a need to provide a light emitting diode, which is insulated from a base and suitable for high drive current operation.

SUMMARY OF THE INVENTION

One aspect of the present invention is to provide a light emitting diode, which is insulated from a base and suitable for high current operation.

In one embodiment of the present invention, the light emitting diode includes a light emitting structure, a silicon substrate, and a bonding layer. The light emitting structure includes two semiconductor layers of different doped types. When a current passes through, the light emitting structure is capable of emitting light. The silicon substrate has two zones of different doped types. The bonding layer is interposed between the light emitting structure and the silicon substrate so that the semiconductor layer and the zone closest to the bonding layer are of different doped types. The bias applied on the light emitting structure in the present invention is a reverse bias with respect to the two zones of the silicon substrate so as to achieve the purpose of insulation. The two zones of the silicon substrate exhibit a Zener diode effect, which is capable of preventing static discharges.

The different doped types include a P type and an N type. Furthermore, at least one of the two zones of the silicon substrate includes a diffusion-doped region. The silicon substrate can be an N-doped P type silicon substrate or a P-doped N type silicon substrate. In another embodiment, the light emitting structure further includes a first ohmic contact metal layer, which contacts one of the two semiconductor layers. The light emitting structure further includes a dielectric layer and a reflection layer. The dielectric layer contacts the first ohmic contact metal layer, and the reflection layer is interposed between the dielectric layer and the bonding layer.

In an exemplary embodiment, the light emitting diode further includes a second ohmic contact metal layer, a first bonding pad, and a second bonding pad. The second ohmic contact metal layer contacts the other one of the two semiconductor layers. The first bonding pad couples to the dielectric layer, and the second bonding pad couples to the second ohmic contact metal layer when the dielectric layer is selected to be a transparent conductive oxide layer.

The two semiconductor layers of the light emitting structure respectively have a material selected from a group consisting of AlGaInP and AlInGan. The bonding layer has a material selected from a group consisting of an alloy of gold and tin, an alloy of lead and tin, and indium.

Another aspect of the present invention is to provide a method of forming a light emitting diode. The method includes providing a light emitting structure including two semiconductor layers of different doped types. The light emitting structure is capable of emitting light when a current passes through. A silicon substrate having two zones of different doped types is also provided. By means of a bonding layer, the light emitting structure and the silicon substrate are bonded together so that the semiconductor layer and the zone closest to the bonding layer are of different doped types. The bias applied on the light emitting structure in the present invention is a reverse bias with respect to the two zones of the silicon substrate so as to achieve insulation purpose. The two zones of the silicon substrate exhibit a Zener diode effect, which is capable of preventing static discharges.

The different doped types include an N type and a P type. The step of providing the silicon substrate includes diffusion-doping the silicon substrate to form at least one of the two zones. In one embodiment, the step of providing the silicon substrate includes providing a P type silicon substrate and doping a portion of the P type silicon substrate to form an N-doped region. Alternatively, the step of providing the silicon substrate includes providing an N type silicon substrate and doping a portion of the N type silicon substrate to form a P-doped region.

The step of providing the light emitting structure includes providing a dummy substrate, forming the two semiconductor layers on the dummy substrate, and forming a first ohmic contact metal layer contacting one of the two semiconductor layers. The step of providing the light emitting structure further includes forming a dielectric layer contacting the first ohmic contact metal layer, and forming a reflection layer interposed between the dielectric layer and the bonding layer.

The step of providing the light emitting structure further includes removing said dummy substrate. A second ohmic contact metal layer contacting the other one of the two semiconductor layers is then formed. A first bonding pad coupling to the dielectric layer is formed. A second bonding pad coupling to the second ohmic contact metal layer is formed when the dielectric layer is selected to be a transparent conductive oxide layer. Alternatively, the step of providing the light emitting structure includes removing a portion of the two semiconductor layers to expose the dielectric layer before the first bonding pad is formed.

The two semiconductor layers respectively have a material selected from a group consisting of AlGaInP and AlIn-Gan. The bonding layer has a material selected from a group consisting of an alloy of gold and tin, an alloy of lead and tin, and indium.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 1:
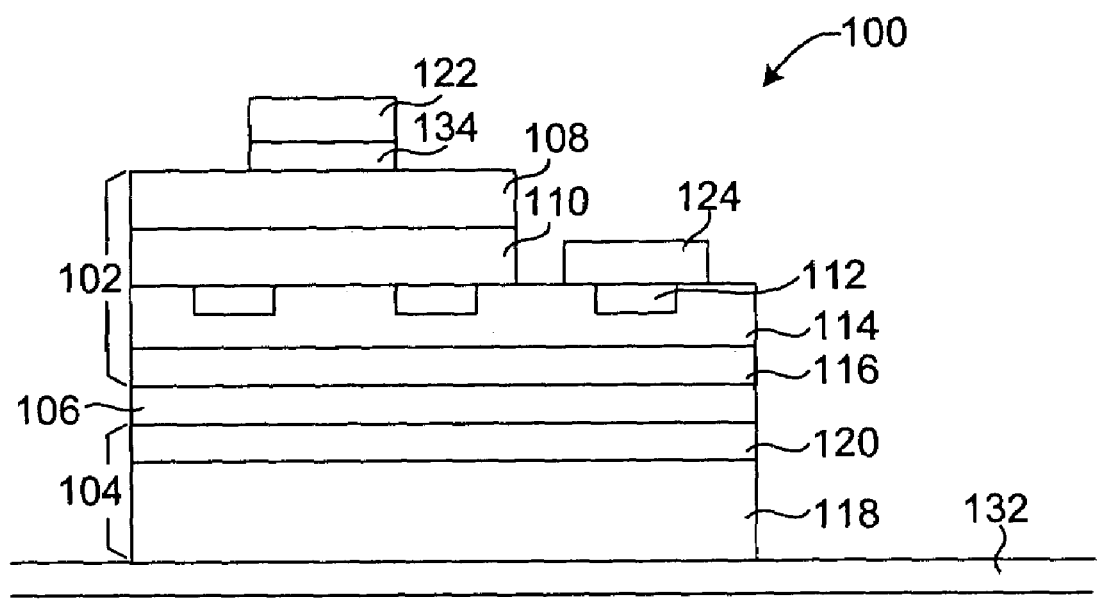
FIG. 1 illustrates a cross-sectional view of a light emitting diode bonded to a base in accordance with a first embodiment of the present invention.

The present invention provides a light emitting diode, which is suitable for high current operation. FIGS. 1–7 illustrate preferred embodiments of the present invention. FIG. 1 illustrates a cross-sectional view of a light emitting diode 100 bonded to a base 132 in accordance with a first embodiment of the present invention. The light emitting diode 100 includes a light emitting structure 102, a silicon substrate 104, and a bonding layer 106. The light emitting structure 102 includes two semiconductor layers of different doped types, 108 and 110. The light emitting structure 102 is capable of emitting light when a current passes through. The silicon substrate 104 has two zones of different doped types, 118 and 120. The bonding layer 106 is interposed between the light emitting structure 102 and the silicon substrate 104 so that the semiconductor layer 110 and the zone 120 closest to the bonding layer 106 are of different doped types. It is noted that the bonding layer 106 is configured to bond the light emitting structure 102 and the silicon substrate 104.

The different doped types include a P type and an N type. For example, in the exemplary light emitting diode 100, the semiconductor layer 108 is doped to be N type, and the semiconductor layer 110 is doped to be P type. At least one of the two zones 118 and 120 can be a diffusion-doped region. For example, the silicon substrate 104 can be an N doped P type silicon substrate. In other words, the zone 120 is an N type doped zone, and the zone 118 is a P type doped zone. In such an arrangement, the bias applied on the light emitting structure 102 with respect to the zones 120 and 118 of the silicon substrate 104 is a reverse bias so that the light emitting structure 102 is insulated from the base 132. Furthermore, the zones 120 and 118 of the silicon substrate 104 exhibit a Zener diode effect, which is capable of preventing static discharges. It is noted that the silicon substrate 104 is exemplarily prepared by the diffusion-doping technique, but other techniques can be implemented as appropriate. Furthermore, in an alternative embodiment, the semiconductor layer 108 can be a P type layer, and the semiconductor layer 110 is an N type layer. Accordingly, the zone 120 is a P type zone, and the zone 118 is an N type zone. For example, the silicon substrate 104 in the alternative embodiment can be a P doped N type silicon substrate.

The light emitting structure 102 further includes a first ohmic contact metal layer 112, which contacts one of the two semiconductor layers, such as the semiconductor layer 110. The light emitting structure 102 further includes a dielectric layer 114 and a reflection layer 116. The dielectric layer 114 contacts the first ohmic contact metal layer 112. The reflection layer 116 is interposed between the dielectric layer 114 and the bonding layer 106. The reflection layer 116 is capable of reflecting lights emitted from the semiconductor layers 108 and 110 so as to improve the light emitting efficiency of the light emitting diode 100. The reflection layer 116 can be made of a material selected from a group consisting of gold, silver, and aluminum.

The light emitting diode 100 further includes a second ohmic contact metal layer 134, a first bonding pad 124, and a second bonding pad 122. The second ohmic contact metal layer 134 contacts the other one of the two semiconductor layers, such as the semiconductor layer 108. The first bonding pad 124 couples to the dielectric layer 114, which can be a transparent conductive oxide layer, such as an indium tin oxide layer (ITO). The second bonding pad 122 couples to the second ohmic contact metal layer 134. It is noted that the layer 114 can be any transparent conductive layer as appropriate.

The two semiconductor layers 108 and 110 respectively have a material selected from a group consisting of AlGaInP and AlInGan. The bonding layer 106 has a material selected from a group consisting of an alloy of gold and tin, an alloy of lead and tin, and indium.

Figure 2:
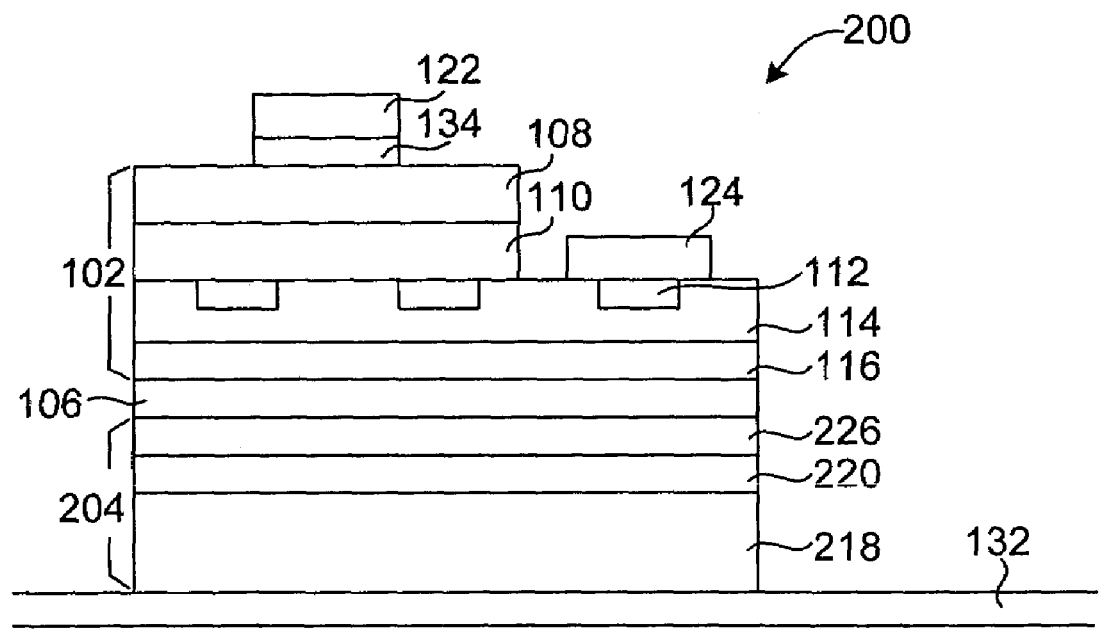
FIG. 2 illustrates a cross-sectional view of a light emitting diode bonded to a base in accordance with a second embodiment of the present invention.

FIG. 2 illustrates a cross-sectional view of a light emitting diode 200 in accordance with a second embodiment of the present invention. The light emitting diode 200 is similar to the light emitting diode 100, except that the silicon substrate is replaced by a silicon substrate 204. Similarly, in this embodiment, the semiconductor layer 108 is doped to be N type, and the semiconductor layer 110 is doped to be P type. Different from the first embodiment, the silicon substrate 204 has three zones 218, 220, and 226. For example, the silicon substrate 204 can be an N doped silicon substrate, which has two portions doped to be a P type zone and an N type zone. In other words, the three zones 218, 220, and 226 respectively are a first N type zone, a P type zone, and a second N type zone. In the second embodiment, the semiconductor layer 110 and the zone 226, which are closest to the bonding layer 106, are of different doped types. Therefore, the light emitting diode 200 can be effectively insulated.

It is noted that the silicon substrate 204 is exemplarily prepared by the diffusion-doping technique, but other techniques can be implemented as appropriate. In an alternative embodiment, the semiconductor layers 108 and 110 can be respectively doped to be P type and N type. Accordingly, the silicon substrate 204 can be a P type doped silicon substrate, which has three zones 218, 220, and 226 respectively doped to be P type, N type, and P type.

Figure 3A:
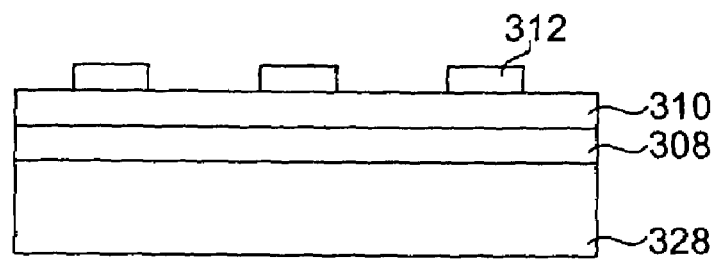
FIGS. 3A and 3B illustrate cross-sectional views of providing a light emitting structure in accordance with embodiments of the present invention.
Figure 3B:
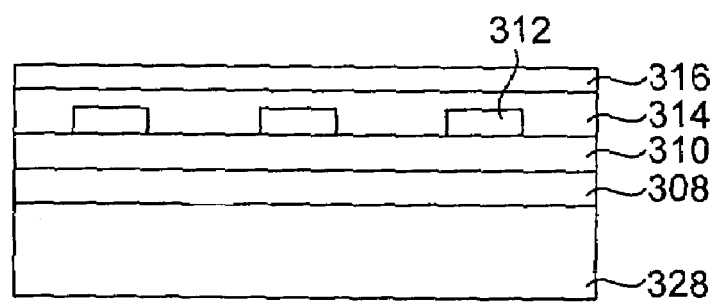

Referring to FIGS. 3A–3B, 4, and 5A–5B, a method of forming a light emitting diode, such as the light emitting diode described above, is illustrated. FIGS. 3A and 3B illustrate cross-sectional views of providing a light emitting structure. As shown in FIG. 3A, a dummy substrate 328 is provided, and two semiconductor layers 308 and 310 are subsequently grown on the dummy substrate 328. The dummy substrate 328 can be a compound semiconductor substrate, which is suitable for epitaxially growing the semiconductor layer 308. For example, the dummy substrate 328 can be a GaAs substrate or a sapphire substrate. Then, a first ohmic contact metal layer 312 which contacts one of the two semiconductor layers, such as the semiconductor layer 310, is formed. As shown in FIG. 3B, a dielectric layer 314 which contacts the first ohmic contact metal layer 312 is then formed. A reflection layer 316 is formed on the dielectric layer 314. The semiconductor layers 308 and 310 are doped to be different types. The light emitting structure emits light when a current passes through. The reflection layer 316 is capable of reflecting light emitted from the semiconductor layers 308 and 310 to improve the light emitting efficiency of the light emitting diode. The reflection layer 316 can be made of a material selected from a group consisting of gold, silver, and aluminum.

Figure 4:
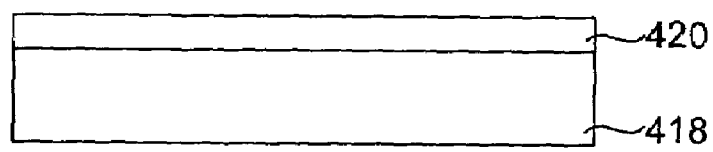
FIG. 4 illustrates a cross-sectional view of providing a silicon substrate in accordance with the first embodiment of the present invention.

FIG. 4 illustrates a cross-sectional view of a provided silicon substrate 404. The silicon substrate 404 has two zones of different doped types, such as an N type and a P type. In one embodiment, when the semiconductor layers 308 and 310 are respectively doped to be N type and P type, a P type silicon substrate can be provided. A portion of the P type silicon substrate is then doped to form an N-doped region. In other words, the N-doped region represents the zone 420, and the rest portion of the P type silicon substrate represents the zone 418. In such an arrangement, the bias applied on the light emitting structure with respect to the zones 420 and 418 of the silicon substrate 404 is a reverse bias so that the light emitting structure is insulated from the base. Furthermore, the zones 420 and 418 of the silicon substrate 404 exhibit a Zener diode effect, which is capable of preventing static discharges. It is noted that the silicon substrate 404 is exemplarily prepared by the diffusion-doping technique, but other techniques can be implemented as appropriate. Furthermore, in an alternative embodiment, the semiconductor layer 408 can be a P type layer, and the semiconductor layer 410 is an N type layer. Accordingly, the zone 420 is a P type zone, and the zone 418 is an N type zone. For example, the silicon substrate 404 in the alternative embodiment can be a P doped N type silicon substrate. That is, an N type silicon substrate is provided, and then a portion of the N type silicon substrate is doped to form a P type region. Therefore, the silicon substrate 404 having zones 418 and 420 of different doped types are formed.

Figure 5A:
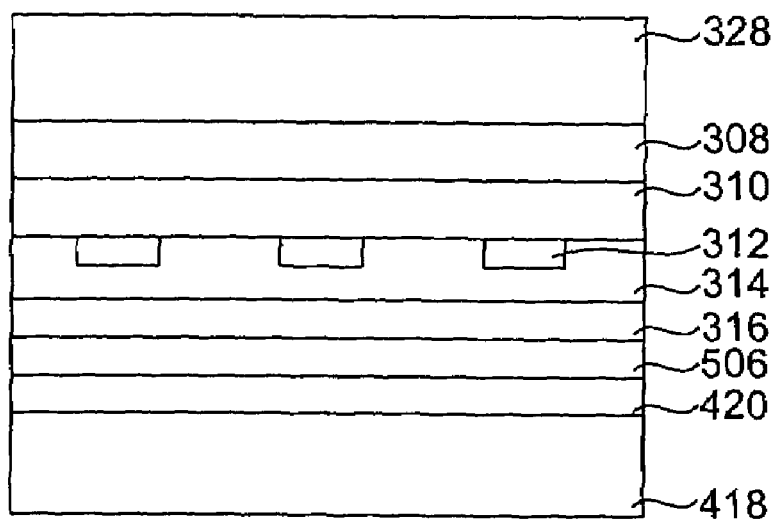
FIGS. 5A and 5B illustrate cross-sectional views of a light emitting diode in accordance with one embodiment of the present invention.
Figure 5B:
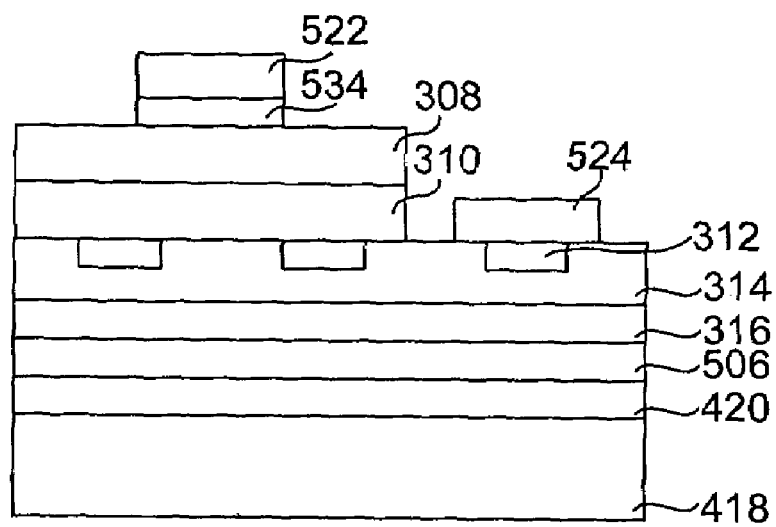

FIGS. 5A and 5B illustrate cross-sectional views after a binding step in accordance with one embodiment of the present invention. As shown in FIG. 5A, by means of a bonding layer 506, the light emitting structure and the silicon substrate 404 are bonded together so that the semiconductor layer 310 and the zone 420 closest to the bonding layer 506 are of different doped types. As shown in FIG. 5B, the dummy substrate 328 is removed. Furthermore, a portion of the two semiconductor layers 310 and 308 are removed to expose the dielectric layer 314. A second ohmic contact metal layer 534 is formed to contact the other one of the two semiconductor layers, such as the semiconductor layer 308.

A first bonding pad 524 is formed to couple to the exposed dielectric layer 314. A second bonding pad 522 is formed to couple to the second ohmic contact metal layer 534. In this embodiment, the dielectric layer 314 can be a transparent conductive oxide layer, such as an indium tin oxide layer (ITO), or any transparent conductive layer as appropriate.

The two semiconductor layers 308 and 310 respectively include a material selected from a group consisting of AlGaInP and AlInGan. The bonding layer 506 includes a material selected from a group consisting of an alloy of gold and tin, an alloy of lead and tin, and indium.

Figure 6:
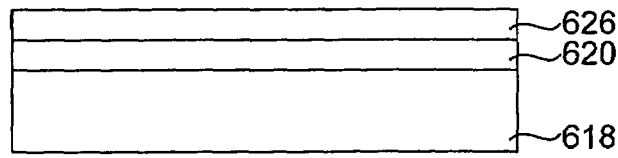
FIG. 6 illustrates a cross-sectional view of a silicon substrate in accordance with the second embodiment of the present invention.
Figure 7A:
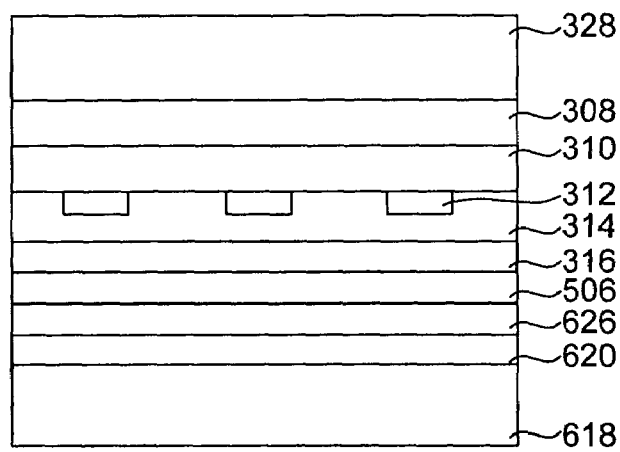
FIGS. 7A and 7B illustrate cross-sectional views of a light emitting diode in accordance with the second embodiment of the present invention.
Figure 7B:
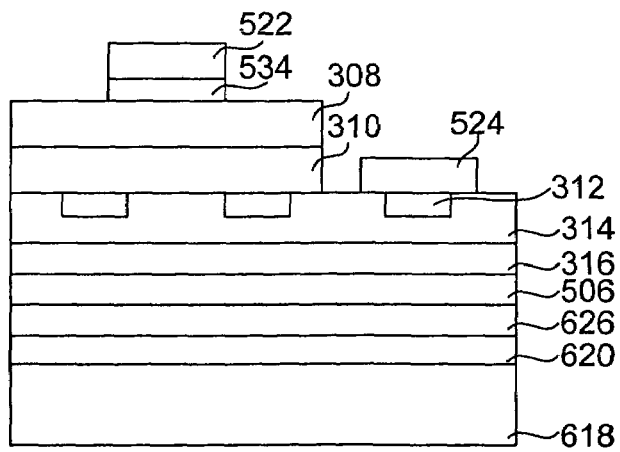

FIGS. 3A, 3B, 6, 7A and 7B illustrate a method of forming a light emitting diode in accordance with another embodiment of the present invention. Different from the method described above, a silicon substrate 604 is provided. As shown in FIG. 6, the silicon substrate 604 has three zones 618, 620, and 626. When the semiconductor layers 308 and 310 are doped to be N type and P type respectively, the step of providing the silicon substrate 604 includes providing an N doped silicon substrate. A portion of the N doped silicon substrate is then diffusion-doped to form a P type region. A portion of the P type doped region is subsequently doped to form an N type region. In other words, the N type doped region represents the zone 626, and the rest portion of the P type doped region represents the zone 620. The rest portion of the N doped silicon substrate represents the zone 618. Therefore, the semiconductor layer 310 and the zone 626, which are closest to the bonding layer 506, are of different doped types so that the light emitting diode can be effectively insulated. It is noted that the silicon substrate 604 is exemplarily prepared by the diffusion-doping technique, but other techniques can be implemented as appropriate. In an alternative embodiment, the semiconductor layers 308 and 310 can be respectively doped to be P type and N type. Accordingly, the silicon substrate 604 can be a P type doped silicon substrate, which has three zones 618, 620, and 626 respectively doped to be P type, N type, and P type.

Although specific embodiments have been illustrated and described, it will be obvious to those skilled in the art that various modifications may be made without departing from what is intended to be limited solely by the appended claims.

What is claimed is:

1. A light emitting diode, comprising:
a light emitting structure comprising two semiconductor layers of different doped types, a first ohmic contact metal layer contacting one of said two semiconductor layers, a dielectric layer contacting said ohmic contact metal layer, and a reflection layer on said dielectric layer, said light emitting structure being capable of emitting light when a current passes through;
a silicon substrate having two zones of different doped types; and
a bonding layer interposed between said reflection layer of said light emitting structure and said silicon substrate so that one of said two semiconductor layers closest to said bonding layer and one of said two zones closest to said bonding layer are of different doped types.

2. The light emitting diode of claim 1, wherein said different doped types comprise a P type and an N type.

3. The light emitting diode of claim 2, wherein at least one of said two zones comprises a diffusion-doped region.

4. The light emitting diode of claim 2, wherein said silicon substrate comprises an N-doped P type silicon substrate.

5. The light emitting diode of claim 2, wherein said silicon substrate comprises a P-doped N type silicon substrate.

6. The light emitting diode of claim 1, further comprising:

a second ohmic contact metal layer contacting the other one of said two semiconductor layers;

a first bonding pad coupling to said dielectric layer; and a second bonding pad coupling to said second ohmic contact metal layer, wherein said dielectric layer comprises a transparent conductive oxide layer.

7. The light emitting diode of claim 2, wherein said two semiconductor layers respectively comprise a material selected from a group consisting of AlGaInP and AlInGan.

8. The light emitting diode of claim 2, wherein said bonding layer comprises a material selected from a group consisting of an alloy of gold and tin, an alloy of lead and tin, and indium.

9. A method of forming a light emitting diode, comprising:

providing a dummy substrate; forming two semiconductor layers of different doped types on said dummy substrate;

forming a first ohmic contact metal layer contacting one of said two semiconductor layers;

forming a dielectric layer contacting said first ohmic contact metal layer;

forming a reflection layer on said dielectric layer;

providing a silicon substrate having two zones of different doped types; and binding said reflection layer of said light emitting structure and said silicon substrate by means of a bonding layer so that one of said two semiconductor layers closest to said bonding layer and one of said two zones closest to said bonding layer are of different doped types.

10. The method of claim 9, wherein said different doped types comprise an N type and a P type.

11. The method of claim 10, wherein said step of providing said silicon substrate comprises:

diffusion-doping said silicon substrate to form at least one of said two zones.

12. The method of claim 10, wherein said step of providing said silicon substrate comprises:

providing a P type silicon substrate; and doping a portion of said P type silicon substrate to form an N-doped region.

13. The method of claim 10, wherein said step of providing said silicon substrate comprises:

providing an N type silicon substrate; and doping a portion of said N type silicon substrate to form a P-doped region.

14. The method of claim 9, further comprising:

removing said dummy substrate;

forming a second ohmic contact metal layer contacting the other one of said two semiconductor layers;

forming a first bonding pad coupling to said dielectric layer; and forming a second bonding pad coupling to said second ohmic contact metal layer, wherein said dielectric layer comprises a transparent conductive oxide layer.

15. The method of claim 14, further comprising removing a portion of said two semiconductor layers to expose said dielectric layer before said first bonding pad is formed.

16. The method of claim 10, wherein said two semiconductor layers respectively comprise a material selected from a group consisting of AlGaInP and AlInGaN.

17. The method of claim 10, wherein said bonding layer comprises a material selected from a group consisting of an alloy of gold and tin, an alloy of lead and tin, and indium.

* * * * *

UNITED STATES PATENT AND TRADEMARK OFFICE
CERTIFICATE OF CORRECTION

| | | |
|---|---|---|
| PATENT NO. | : 7,148,517 B2 | Page 1 of 1 |
| APPLICATION NO. | : 10/951043 | |
| DATED | : December 12, 2006 | |
| INVENTOR(S) | : Tu et al. | |

It is certified that error appears in the above-identified patent and that said Letters Patent is hereby corrected as shown below:

Column 7, Line 10, delete "AlInGan" and add -- AlInGaN --.

Signed and Sealed this

Thirteenth Day of March, 2007

JON W. DUDAS
*Director of the United States Patent and Trademark Office*